Nov. 22, 1966 M. P. LEPSELTER 3,287,612

SEMICONDUCTOR CONTACTS AND PROTECTIVE COATINGS FOR PLANOR DEVICES

Filed Dec. 17, 1963 2 Sheets-Sheet 1

INVENTOR
M. P. LEPSELTER
BY [signature]
ATTORNEY 3,287,612
Patented Nov. 22, 1966

3,287,612

SEMICONDUCTOR CONTACTS AND PROTECTIVE COATINGS FOR PLANAR DEVICES

Martin P. Lepselter, Franklin Park, N.J., assignor to Bell Telephone Laboratories, Incorporated, New York, N.Y., a corporation of New York Filed Dec. 17, 1963, Ser. No. 331,168
7 Claims. (Cl. 317—235)

This invention relates to semiconductor devices and more particularly to combinations of insulating and conducting films for protecting and contacting semiconductor devices and methods of making such films.

It has been a long sought objective in the semiconductor device art to minimize the protective encapsulation which generally has been necessary to ensure the long life stability of semiconductor devices. This art is replete with a variety of coatings, both organic and inorganic, and presently uses metal-glass housings in a variety of sizes and configurations. More recently, in the art there have been disclosures of the use of dielectric oxide films for passivating and protecting the active surfaces of semiconductor devices. Insofar as applicant is aware, all of the foregoing arrangements involve disadvantages and drawbacks. The use of metal-glass housings increases the size, complexity, and cost of semiconductor devices and the various kinds of protective coatings, on the other hand, apparently suffer some type of leakage and deterioration with time.

Accordingly, an object of this invention is an improved semiconductor device in which the need for a metal-glass encapsulation is eliminated.

An ancillary object is to seal the active surfaces of a semiconductor device by means of deposited layers of dielectrics and metals.

Another object of the invention is to improve the geometric definition of the boundaries of deposited layers on semiconductor devices.

Another object is to improve and simplify the fabrication of semiconductor devices.

In general terms, this invention, in one aspect, is based on the discovery that the interface between a layer of an active metal such as titanium or tantalum and a dielectric oxide such as silicon dioxide provides an extremely poor path for the penetration of deleterious atmospheres. Accordingly, the first step in hermetically sealing the active surface of a semiconductor device, that is, a surface which is intersected by the boundaries of PN junctions, is to provide a coating of silicon dioxide upon which, in turn, there is deposited a layer of an active metal. However, in accordance with another aspect of the invention, protection of the active surface is not complete until an additional layer of a contact metal such as platinum, silver or gold, or a combination thereof, is provided atop the active metal layer, covering and extending beyond the vertical projection of the underlying PN junctions. Thus, with a structure such as the foregoing, it appears that lateral penetration along layer interfaces is inhibited by the oxide to active metal combination while diffusion transversely through the somewhat porous active metal and oxide layer is precluded by outer coatings of contact metals such as platinum, silver and gold.

Moreover, this overlayer of contact metal advantageously may consist of two metals, specifically, platinum and gold. This particular combination has been found advantageous also from the standpoint of mechanical strength for supporting portions of semiconductor material during fabrication operations where separation is accomplished by chemical etching.

The invention and some of its features may be better understood from the following detailed description taken in connection with the drawing in which.

Figure 1:
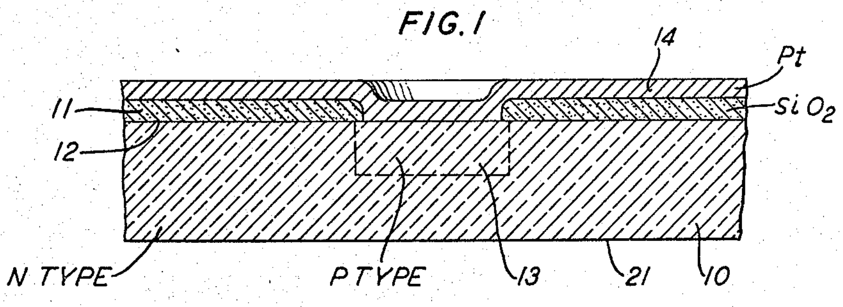
FIGS. 1, 2 and 3 depict in cross section, successive semiconductor structures obtained during one preferred method in accordance with this invention.

Referring to FIG. 1, there is shown in cross section a portion of a slice of semiconductor material from which a single PN junction diode is fabricated. In FIG. 1 the substrate 10 is a portion of a slice of silicon single crystal semiconductor material. In this example the main portion of the slice is of N-type conductivity. On the upper surface 12 of the slice there is a thermally grown coating of silicon dioxide 11 in which a small, round hole has been opened to expose a portion of the surface 12. By means of a solid state diffusion treatment using a vapor containing a P-type conductivity impurity such as boron tetrachloride a small zone 13 has been converted to P-type conductivity. These steps are well known in the art as disclosed, for example, in Patent 3,122,817, issued March 3, 1964 to J. Andrus.

In order to provide good ohmic contact to the P-type diffused region 13, a preferred next step is to deposit over the entire upper surface, including the oxide film, a very thin layer 14 of platinum. This is readily done either by evaporation deposition or cathodic sputtering. This layer is relatively thin, typically of the order of a hundred angstroms.

The assembly, including the deposited platinum coating, then is heated for a brief period of about five to ten minutes at a temperature of between 500 and 600 degrees centigrade. This heat treatment causes the thin platinum layer to chemically react with the surface of the diffused P-type region. This is a solid phase reaction and results in the formation of a platinum silicide with substantially no lateral spreading or balling as is common with liquid phase reactions. This is particularly significant inasmuch as other contact metals such as aluminum or gold, if used instead of platinum, provide a liquid phase reaction which enables a rapid, often erratic and uncontrollable diffusion of impurities which readily cause a "shorting-out" of the junction particularly near the surface 12. Accordingly, the above-noted temperature range is important in producing the desired result. The platinum film tends to gather in small islands 14 both on the silicon surface and on the oxide surface. As just described, the areas on the silicon form good ohmic contacts to the P-type zone 13 as a consequence of the solid phase reaction.

Figure 2:
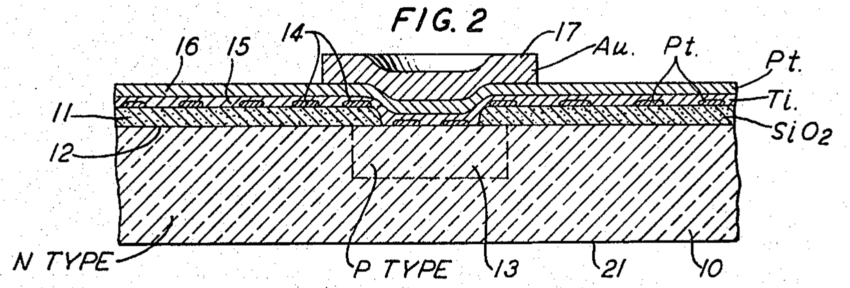

Referring to FIG. 2, the device surface next is coated with a layer 15 of an active metal, typically titanium. Methods for advantageously sputtering a variety of metals are described in the copending application of H. C. Theuerer, Serial No. 296,550, filed July 22, 1963, having the same assignee as this application. Cathode sputtering is a relatively cold process, but there is an initial reaction between the titanium and the silicon dioixde film which results in the hermetic seal at the surfaces. The reaction is limited, however, at these low temperatures so that there is no substantial penetration of metal into the oxide. Electrical contact from the titanium layer 15 to the P-type zone 13 is reliably achieved through the previously applied platinum layer 14 by covering and joining the various, discrete platinum areas together electrically by means of the titanium layer 15. Thus, the titanium layer 15 tends to encompass and surround what are now "islands" or isolated portions of platinum.

In my Patent 3,106,489, issued October 8, 1963, there is described the deposition of active metal layers such as titanium and tantalum on top of oxide-coated semiconductor surfaces. In that patent, however, a subsequent heat treatment reacts the metal with the oxide so as to convert the former substantially completely to an oxide and to enable is penetration through the oxide to make electrical contact to the underlying the semiconductor material. In accordance with this invention, the oxide layer 11 remains in place as a partially protective layer with the active metal layer 15 of titanium overlying it.

Referring again to FIG. 2, a layer 16 of a metal, in this case platinum, is deposited on top of the titanium film to inhibit the formation of a natural oxide thereon, when exposed to the atmosphere. Following this a layer 17 of a contact metal such as gold is deposited, conveniently by the electroforming process using KPR masks so as to limit somewhat the size of the gold contact to the extent necessary to cover the PN junction boundaries. In particular, the gold layer extends well beyond the vertical projection of the underlying PN junction. However, this is a relatively imprecise operation compared to those in which deposition patterns must be produced within limits of one-tenth of a mil as is necessary in some prior art devices.

Figure 3:
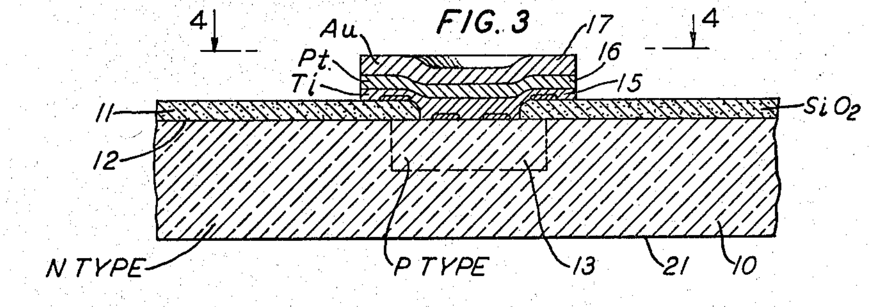
Figure 4:
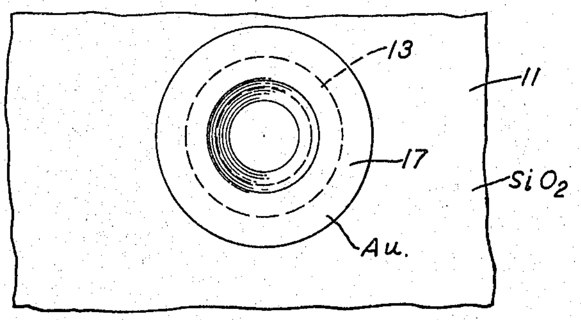
FIG. 4 is a plan view of the structure illustrated in section in FIG. 3.

Finally, referring to FIG. 3, the peripheral portions of the deposited titanium-platinum layers 15, 16 are removed by an operation termed back-sputtering during which the thick gold layer 17, in effect, acts as a mask. In this operation the device surface is made cathodic so as to enable the removal of material from the surface thereof when it is bombarded.

In particular, the slice of semiconductor material may be placed on a cathode of a suitable material such as platinum and exposed to ion bombardment which causes a differential removal of the exposed material on the semiconductor slice. However, it has been found that in the fabrication of deivces using this technique any oxide films present may be rendered ineffective for subsequent device use by the presence of high electric fields created for the process. Accordingly, it has been found necessary to utilize a fringing field or sheath surrounding the work piece from which particules are reflected to strike the semiconductor surface and cause material removal. Such a fringing field can be produced by mounting the semiconductor slice on an insulating spacer of proper dimensions so as to permit the formation of the field around the periphery of the dielectric spacer.

The result of the back-sputtering process is a somewhat thinner outer layer 17 of gold and underlying titanium-platinum layers 15, 16 coextensive with the gold. Alternatively, a titanium-silver combination may be substituted for titanium-platinum and the silver may be removed by an etching operation using ferric nitrate. Likewise, other metals disclosed in my patent referred to hereinbefore may be used in combination with the titanium, including nickel, palladium and rhodium. The structure depicted in FIG. 3 then may be separated from the remainder of the slice and fabricated into a PN junction diode by affixing suitable wire leads, one to the gold layer 17 and the other to the bottom surface 21 of the silicon element which, as is well known in the art, is suitably metal plated using nickel or gold so as to enable mounting on a large are surface or the attachment of a ribbon-type metal lead. Moreover, experience has shown that the device needs no further encapsulation from an electrical standpoint. The combination of layers of contact metal, active metal and oxide provide complete long-time protection for the active surface of the semiconductor device. In most instances, some further coating may be advantageous for mechanical protection and ease of handling.

Certain alternatives are available which, however, are within the general scope and spirit of this invention. For example, the initial platinum film may be omitted and the assembly may be heat treated briefly after deposition of the active metal layer of titanium. This will enable formation of a good ohmic contact at the surface of the P-type zone 13 and, if the treatment is brief, will react only a small amount of the total thickness of the oxide layer with the titanium film. Therefore, a sufficient thickness of oxide and active metal will remain to provide the necessary insulation along with an hermetically sealed interface between oxide and metal.

In another alternative diode structure, the titanium-platinum-gold layers 15, 16, 17 may be carried to and beyond an edge of the wafer in the form of a ribbon. Then a second layer of oxide is deposited over the metal layers and extending beyond the vertical projection of the underlying PN junctions. Then over this oxide layer of limited extent a final protective coating of the three aforementioned metals is deposited. This oxide metal outer protection has been referred to in the vernacular as a "skull cap" configuration.

Moreover, in addition to titanium and tantalum, certain other metals may be utilized for the layer in contact with the oxide. In general, these metals are referred to herein as active metals and are certain of those classified in groups IV B, V B and VI B of the Periodic Table. Specifically, the group includes titanium, zirconium, hafnium, vanadium, tantalum, niobium and chromium.

Figure 5:
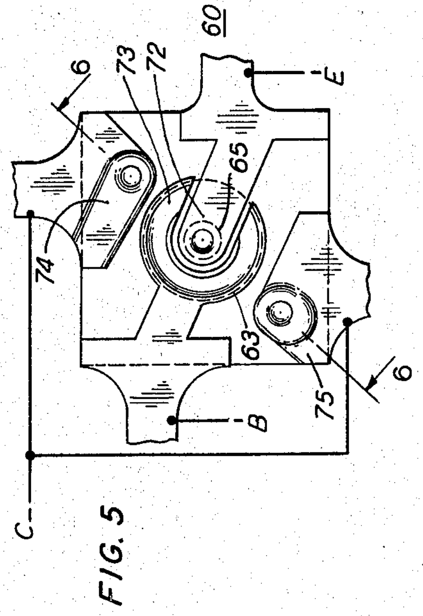
FIG. 5 is a plan view, partially schematic, of a transistor structure embodying the invention.
Figure 6:
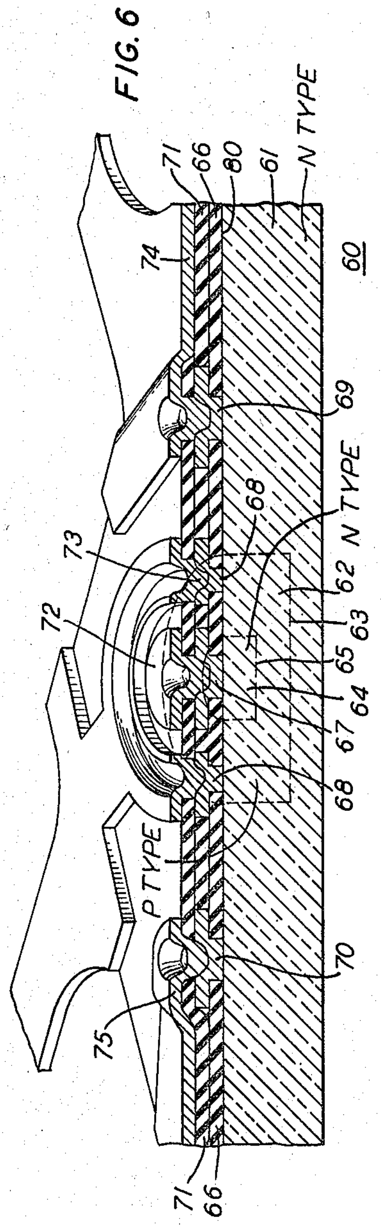
FIG. 6 is a section of the structure shown in FIG. 5.

The invention is illustrated further in the embodiment of FIGS. 5 and 6 showing a transistor. In the plan view of FIG. 5, the device 60 is shown to have an emitter terminal, designated schematically by E, a base connection B and a pair of collector electrodes brought out to a common terminal C. These leads are purely illustrative to show the relationship of the metal electrodes on the device.

Referring to FIG. 6, the device 60 comprises a wafer of single crystal silicon semiconductor material originally of N-type conductivity. Actually, the wafer illustrated may be only a part of a larger slice of material on which a plurality of similar devices are fabricated. The individual devices then are produced by dividing the slice at appropriate boundaries as will be explained hereinafter. For purposes of explanation, only a single transistor element will be described, and again it will be understood that the illustrations are exaggerated in certain dimensions in order to more clearly explain the invention.

The original N-type portion 61 of the wafer comprises the collector zone of the completed device. A P-type conductivity base region 62 defined by the PN junction 63 is produced by diffusing a P-type impurity through an oxide mask on the upper surface of the wafer. Subsequently, the mask is re-formed to enable diffusion of the smaller N-type region 64 defined by the PN junction 65. The region 64 constitutes the emitter zone of the transistor. These steps are conventional and well known in the art for making diffused junction transistors.

The next step is the formation of a film of silicon oxide as a layer 66 on the surface 80 of the wafer. A series of openings are made in the oxide layer 66 to enable deposition in spaced-apart relation, respectively, of a pair of collector contacts 69 and 70, a base contact 68 in the form of a ring, and an emitter contact 67. Each of these contacts comprises multiple layers of metals protectively overlying the oxide layer 66 and the PN junction boundaries as described previously in this disclosure. A first layer of titanium on each of these contacts then is supplemented by additional layers of platinum and gold in order to complete the protective sealing over the PN junction boundaries. Typically, the metal layers are of the following thicknesses:

| | Angstroms |
|---|---|
| Titanium | 1,000 |
| Platinum | 5,000 |
| Gold | 120,000 |

It should be noted particularly, that both the emitter and base contacts extend beyond the vertical projection of the entire base and emitter junction boundaries, respectively, thus providing the protection against transverse diffusion of contaminants.

To complete the structure and to provide external leads, another silicon oxide layer 71 is deposited over the entire surface of the device. Again openings are made in this layer 71 to enable penetration of the contacts. In particular, a metal emitter contact 72, a base contact 73 and collector electrodes 74 and 75 are deposited in accordance with the patterns best seen in FIG. 5. Again each of these electrodes is composed of a layered structure of titanium, platinum and gold similar to the contacts first laid down for each of the conductivity type zones. It should be noted, in particular, that by this configuration there is provided the necessary electrical separation of the respective electrodes of the transistor. Accordingly, the boundaries of the PN junctions 63 and 65, where they intersect the surface 80, are protected by a metal-to-oxide interface which presents a relatively long path to the penetration of any contaminating ions along the interface. Moreover, the overlayer of relatively heavy metal inhibits the vertical penetration through the successive layers which might affect the operation and characteristics of the device.

The above-described arrangement of protective layers is likewise adaptable to the so-called linear transistor structure in which the base and emitter electrodes are closely spaced, narrow metal stripes. In a device of this type the base and emitter leads are brought out to opposite sides of the device using the titanium-platinum-gold multilayer as disclosed above. However, over the central active portion of the device represented by the vertical projection of the junction boundaries, the "skull cap" configuration is used as a final protective coating consisting of an oxide layer and an overlying dense metal layer.

In particular, the relatively heavy metal leads provide a completely satisfactory mechanical support for the individual devices 60 during and after their separation. As noted heretofore, the fabrication conveniently is done in slice form with a large number of individual devices being produced on a single slice. Finally, after the metal leads are deposited, the slice is turned over and a suitable mask, for example, of wax or gold, is provided on the reverse surface which is in registration with the areas of the individual devices. The slice then simply is treated with an etchant, for example, the well-known hydrofluoricnitric acid mixture, which attacks the silicon semiconductor material not protected by the mask. Consequently, the boundaries between the individual devices are etched out except for the heavy metal leads or tabs which provide complete support for the resulting semiconductor wafers. Although the etchant specified will attack the titanium underlayer, the heavier layers of platinum and gold, which are completely etch-resistant, provide more than sufficient strength.

Moreover, it will be apparent that the leads or tabs provide a complete means of connecting the devices to other apparatus without complex bonding operations or the use of fine wire leads customarily employed. For example, the devices may be very simply mounted and bonded using a standard multielectrode tool to affix it to a printed circuit board.

It will be apparent that this technique can be applied advantageously to the fabrication of integrated circuits where the individual elements may be semiconductor devices of different types, and the entire assembly after the separating treatment by etching may be mounted on a suitable common base or back piece. In particular, this method of fabrication is useful in providing a structure in which electrical coupling between elements of the circuit is completely eliminated by absolute dielectric separation between such elements.

Moreover, where the assembly in slice form is to be separated into individual or groups of devices or elements, the metal tabs or leads may be left projecting from the edges of the semiconductor wafer so as to provide a convenient contacting means to metallized areas of printed circuits or to terminal posts and the like.

Although the invention has been described in terms of certain specific embodiments, other arrangements may be devised by those skilled in the art which will be within the spirit and scope of the invention.

In particular, although the invention has been taught particularly in terms of the use of silicon semiconductor material, it may be practiced using other semiconductor materials such as germanium or gallium arsenide. In general, the criterion is that the semiconductor shall be one on which an adherent insulator can be deposited. Moreover, the principles of this invention may be applied to a variety of semiconductor devices including diodes, transistors and diffused resistors. In general, it is useful wherever PN junction boundaries intersect a surface and where it is desirable to seal such a surface from the operating ambient. Moreover, as has been pointed out, the concepts involved are useful for devices in which it is advantageous to bring out connecting leads in ribbon form between protective layers of properly sealed oxide coatings where such leads of etch-resistant material themselves provide support for subsequent fabrication steps.

What is claimed, is:

1. A semiconductor device comprising a body of silicon of one conductivity type having a major plane surface, a zone of opposing conductivity type adjoining a portion of said surface, said zone being defined by a PN junction whose edge intersects said surface, a layer of silicon exide on said major surface and overlying said PN junction edge, said oxide layer having an opening therethrough to expose a portion of the surface of said zone, a layer of titanium in contact with the exposed surface within said opening and overlying the adjacent portion of the oxide layer, a second metal layer of platinum overlying the titanium layer and extending beyond the projection of the entire edge of said PN junction, and a third metal layer of gold completely overlying said platinum layer.

2. A semiconductor signal translating device of the planar type having at least two successively diffused zones one within the other of alternating conductivity type in a body of monocrystalline semiconductor material, both of said zones being defined by PN junctions having their entire edges in one major plane surface, a layer of dielectric oxide on said major plane surface overlying the edges of said PN junctions, said dielectric oxide layer having openings therethrough to expose a portion of the surface of each of said underlying conductivity type zones, separate metal contacts in each of said openings and overlying a portion of the surrounding oxide layer, each said metal contact comprising a first layer of an active metal and an overlying layer of contact metal, said contact metal layers extending over and beyond the projection of the entire edge of all of the planar PN junctions, a second dielectric oxide layer on said major plane surface overlying said first oxide layer and said metal contacts, said second oxide layer having openings therethrough exposing portions of each of said metal contacts, and second metal contacts in each of said openings similar in structure to said first metal contacts, said second metal contacts being composed of patterns for making external connection to said device.

3. A semiconductor device in accordance with claim 2 in which the semiconductor material is silicon and the dielectric oxide is silicon oxide.

4. A semiconductor device in accordance with claim 2 in which the active metal layer is titanium.

5. A semiconductor device in accordance with claim 2 in which the overlying contact metal layer comprises platinum and gold.

6. A semiconductor device in accordance with claim 2 in which the metal contacts comprise successive layers from bottom to top of about 1000 Angstroms of titanium, about 5000 Angstroms of platinum, and about 120,000 Angstroms of gold.

7. In the fabrication of a semiconductor device of the planar type the steps of diffusing a significant impurity through an oxide mask on one surface of a region of semiconductor material of one conductivity type thereby to produce a zone of opposite conductivity type in a portion of said region adjoining said one surface, said oxide mask overlying the edge of the PN junction defining said zone, the entire edge of said PN junction intersecting said one surface, said oxide film having an opening therethrough exposing a portion of the surface of said opposing conductivity type zone, depositing by cathodic sputtering a layer of an active metal in said opening in contact with the surface of said zone and overlying the surrounding portions of said oxide film to an extent beyond the projection of the entire edge of said PN junction, depositing on said active metal layer a further layer of a contact metal likewise extending beyond the projection of said PN junction edge, and removing by cathodic back-sputtering portions of the first deposited active metal layer not covered by said contact metal layer.

References Cited by the Examiner

UNITED STATES PATENTS

| | | | |
|---|---|---|---|
| 2,705,768 | 4/1955 | Kleimack et al. | 317—235 |
| 2,973,466 | 2/1961 | Atalla et al. | 317—240 |
| 3,158,788 | 11/1964 | Last | 317—101 |
| 3,184,824 | 5/1965 | Fairbairn | 29—25.3 |
| 3,212,162 | 10/1965 | Moore | 29—25.3 |

JOHN W. HUCKERT, *Primary Examiner.*

R. SANDLER, *Assistant Examiner.*